United States Patent
Hsu

(10) Patent No.: US 7,313,294 B2
(45) Date of Patent: Dec. 25, 2007

(54) STRUCTURE WITH EMBEDDED OPTO-ELECTRIC COMPONENTS

(75) Inventor: Shih-Ping Hsu, Hsin-chu (TW)

(73) Assignee: Phoenix Precision Technologies Corporation (TW)

( * ) Notice: Subject to any disclaimer, the term of this patent is extended or adjusted under 35 U.S.C. 154(b) by 55 days.

(21) Appl. No.: 11/250,111

(22) Filed: Oct. 12, 2005

(65) Prior Publication Data

US 2007/0053627 A1    Mar. 8, 2007

(30) Foreign Application Priority Data

Oct. 12, 2004    (TW) .............................. 93130824 A

(51) Int. Cl.
*G02B 6/12*    (2006.01)
(52) U.S. Cl. ................... 385/14; 385/129; 385/130
(58) Field of Classification Search ............... 385/14, 385/129
See application file for complete search history.

(56) References Cited

U.S. PATENT DOCUMENTS

| | | | |
|---|---|---|---|
| 2003/0015720 A1* | 1/2003 | Lian et al. | 257/98 |
| 2006/0120660 A1* | 6/2006 | Rolston et al. | 385/15 |

\* cited by examiner

*Primary Examiner*—Jennifer Doan
(74) *Attorney, Agent, or Firm*—Morland C. Fischer

(57) ABSTRACT

A structure with embedded opto-electric components includes a carrier; at least one circuit board having a cavity and mounted on a carrier; at least one waveguide embedded in an inner layer of the circuit board and mounted on the carrier; at least one first opto-electric component embedded in the inner layer of the circuit board, and having an active terminal in contact with a transmission terminal of the waveguide; and at least one second opto-electric component mounted on the circuit board, and having an active terminal corresponding in position to another transmission terminal of the waveguide via the cavity. Since the first opto-electric component and the waveguide are in contact with each other and embedded in the circuit board, an optical transmission mechanism is simplified and times of reflection are decreased, thereby reducing errors and loss during transmission.

13 Claims, 4 Drawing Sheets

STRUCTURE WITH EMBEDDED OPTO-ELECTRIC COMPONENTS

FIELD OF THE INVENTION

The present invention relates to structures with embedded opto-electric components, and more particularly, to a structure for fixing and embedding opto-electric components in a carrier.

BACKGROUND OF THE INVENTION

Along with continuous development of the semiconductor technology, semiconductor packages are required to not only have a compact size and a small profile but also have enlarged capacity for data storage. In light of increase in a load of data to be processed, relatively higher processing efficiency is achieved by processing data of the same size in a faster speed. The most direct way to enhance the processing speed of a semiconductor is to increase a frequency used by the semiconductor. However, in the case of a data transmission rate reaching a degree of Gb/s, several drawbacks are caused such as difficulty in efficiently dissipating heat, delay of signal time, electromagnetic interference, and so on, making fabrication of a semiconductor with higher performance become difficult. In particular for conventionally using copper circuits as data signal transmission media, conductivity of the copper circuits is hardly improved due to a limitation of the material characteristic thereof, such that the speed of signal transmission cannot be enhanced by a try to improve the conductivity.

For a structure using metal circuits to transmit signals, it is easily affected by interference from external noise or interference between internal circuits during a signal transmission process, thereby causing errors in signal transmission due to the interference. Accordingly, the structure for signal transmission should be provided with a suitable protective mechanism to prevent an influence from the interference on the signals especially in the case of high frequency transmission. However, such protective mechanism leads to considerable difficulty in a circuit design and requires an additional structural design, making the design and fabrication costs undesirably increased and thereby not effective to solve the problem in the current situation.

The conventional technology of signal transmission utilizes analog signal transmission by passing a current through an electrical conductor. However, the current signal processing method within circuits is mostly by digital processing, and signal conversion during the signal transmission process easily causes distortion and errors in data transmission after the signal conversion.

In order to overcome the drawbacks caused by the conventional analog signal transmission structure, a new technology is proposed to employ optical signals for transmission in place of electrical signals, which has a significant advantage that the optical signals are almost not interfered by electromagnetic waves, such that the quality of signal transmission is improved and distortion of signal transmission can be reduced. Further, it is not necessary to design a mechanism for preventing interference from the electromagnetic waves, thereby reducing the design and fabrication costs. As a result, the optical signal transmission technology becomes the mainstream of development.

The conventional optical signal transmission technology primarily uses a plurality of signal processing components such as optic fibers, an optic connector, an optical-to-electronic converter, an electronic-to-optical converter, and so on to perform digital data transmission. However, this technology is not favorable for the design of having a compact size and a small profile due to a requirement of high precision of optical alignment and a large system volume. Accordingly, it has been gradually evolved to design an opto-electric transmission system on a printed circuit board so as to improve the quality of transmission.

A conventional opto-electric transmission structure incorporated in a printed circuit board, as shown in FIG. 1A, comprises a waveguide 22 mounted on an upper surface of a carrier 21, wherein reflection surfaces 22a, 22b are respectively formed at two terminals of the waveguide 22 and positioned by an angle of 45 degrees relative to the upper surface of the carrier 21; a circuit board 23 mounted on the waveguide 22, and formed with two channels 231 at positions respectively above the reflection surfaces 22a, 22b at the two terminals of the waveguide 22; and an optical active component 24 and an optical receiving component 25 mounted on the two channels 231 of the circuit board 23 respectively.

Another conventional opto-electric transmission structure, as shown in FIG. 1B, comprises a waveguide 22 mounted on a carrier 21; two elevated circuit boards 23' mounted on the carrier 21 and positioned above two terminals of the waveguide 22 respectively; and an optical active component 24 and an optical receiving component 25 attached to bottom surfaces of the circuit boards 23' respectively, and located right above reflection surfaces 22a, 22b formed at the two terminals of the waveguide 22 respectively.

The optical active component 24 is for example a laser diode (LD), a light emitting diode (LED), or a vertical cavity surface emitting laser (VCSEL) diode. The optical passive component 25 is for example a photodiode (PD).

The structure of the waveguide 22 comprises a core layer 221 covered by a cladding layer 222, as shown in FIG. 2, wherein a refractive index (n1) of the core layer 221 is larger than a refractive index (n2) of the cladding layer 222, i.e. n1>n2. As shown in FIGS. 1A and 1B, when a photo beam from the optical active component 24 is emitted to the reflection surface 22a at one terminal of the waveguide 22, the reflection surface 22a allows the photo beam to be transmitted in the core layer 221 to the reflection surface 22b at the other terminal of the waveguide 22 by the total reflection principle, and the reflection surface 22b allows the photo beam to be reflected upwardly to the optical receiving component 25, such that optical transmission can be achieved by the waveguide 22 mounted on the carrier 21.

However, a drawback caused by the above conventional structure is that, it is difficult to form the pair of 45-degree reflection surfaces 22a, 22b at the two terminals of the waveguide 22. The above conventional structure also requires high precision of optical alignment and thus increases the fabrication costs thereof.

Further, since the photo beam must undergo two reflections via the reflection surfaces 22a, 22b, it may cause relatively greater loss of optical signals.

Referring to the conventional structure shown in FIG. 1A, as the optical active component 24 and the optical receiving component 25 are both mounted on one side of the circuit board 23, and the circuit board 23 must be formed with the two channels 231, this arrangement occupies a large area on the circuit board 23 and thus reduces a circuit layout area of the circuit board 23, such that the area of the circuit board 23 must be undesirably enlarged.

Referring to the conventional structure shown in FIG. 1B, the optical active component 24 and the optical receiving component 25 are attached to the elevated circuit boards 23'. However, this arrangement increases the overall thickness of the structure by using the elevated circuit boards 23' and similarly leads to the area occupying drawback, such that the requirement of having a compact size and a small profile cannot be satisfied for the structure.

The optical active component 24 and the optical receiving component 25 also require high alignment precision (usually smaller than 20 μm) in emitting and receiving the photo beam, which is substantially equal to the precision required by a substrate for flip-chip connection. Thus, the assembly costs and difficulty in fabrication control of the structure are increased, thereby raising the fabrication costs.

Moreover, there is no heat dissipating structure provided for the optical active component 24 and the optical receiving component 25, such that the overall heat dissipating effect is not satisfactory, and the optical active component 24 and the optical receiving component 25 may easily be damaged by overheating.

Therefore, it is greatly desired to overcome the drawbacks caused by the foregoing conventional technology such as relatively greater loss of optical energy, occupation of substrate area, a complicated structure, high assembly costs, unsatisfactory heat dissipating performance, and so on.

SUMMARY OF THE INVENTION

In light of the above drawbacks in the conventional technology, an objective of the present invention is to provide a structure with embedded opto-electric components, which can reduce loss of a photo beam during a transmission process.

Another objective of the present invention is to provide a structure with embedded opto-electric components, which can modularize optical/electronic conversion.

Still another objective of the present invention is to provide a structure with embedded opto-electric components, so as to prevent occupation of space and reduce a volume of the structure.

A further objective of the present invention is to provide a structure with embedded opto-electric components, which can simplify the structure and decrease the fabrication costs thereof.

A further objective of the present invention is to provide a structure with embedded opto-electric components, so as to allow the opto-electric components to be directly connected to a waveguide such that errors in optical alignment and the assembly costs are reduced.

A further objective of the present invention is to provide a structure with embedded opto-electric components, which can enhance a heat dissipating effect.

In accordance with the above and other objectives, the structure with embedded opto-electric components according to a preferred embodiment of the present invention comprises: a carrier; at least one circuit board with a circuit layer, such as a printed circuit board or an IC (integrated circuit) package substrate, the circuit board being mounted on a surface of the carrier and having a cavity; at least one waveguide embedded in an inner layer of the circuit board, and mounted on the surface of the carrier; at least one first opto-electric component having an active terminal and embedded in the inner layer of the circuit board, wherein the active terminal of the first opto-electric component is in contact with a transmission terminal of the waveguide; and at least one second opto-electric component having an active terminal and mounted on a surface of the circuit board not attached to the carrier, wherein the active terminal of the second opto-electric component corresponds in position to another transmission terminal of the waveguide via the cavity of the circuit board.

The waveguide has a reflection surface positioned by an angle of 45 degrees relative to the carrier, wherein the reflection surface is located at the transmission terminal of the waveguide corresponding in position to the active terminal of the second opto-electric component, such that photo beam signals from the first opto-electric component are directly emitted to the second opto-electric component via the reflection surface. As the photo beam signals undergo only one reflection, photo beam loss is reduced during a transmission process and the quality of transmission can be improved.

The circuit board may comprise an upper board and a lower board, wherein the first opto-electric component and the waveguide are embedded in a receiving space of the lower board to avoid occupying the surface area of the circuit board. The first opto-electric component is in contact with the waveguide, such that the photo beam signals from the first opto-electric component are directly transferred to the waveguide without reflection transmission, and the overall structure can thus be made with a compact size and a small profile.

Since the first opto-electric component and the waveguide are embedded in the receiving space of the circuit board and are in contact with each other, a part of optical alignment is not required, and fabrication processes of the structure are simplified thereby facilitating assembly and reducing the fabrication costs.

The carrier can be an organic substrate, a metallic plate or a ceramic plate. When the carrier is a metallic plate or a ceramic plate, the carrier may serve as a heat dissipating structure for the first opto-electric component and the waveguide to enhance a heat dissipating effect.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a structure with embedded opto-electric components proposed in the present invention are described as follows with reference to FIGS. 3A-3C, 4 and 5.

Figure 1A:
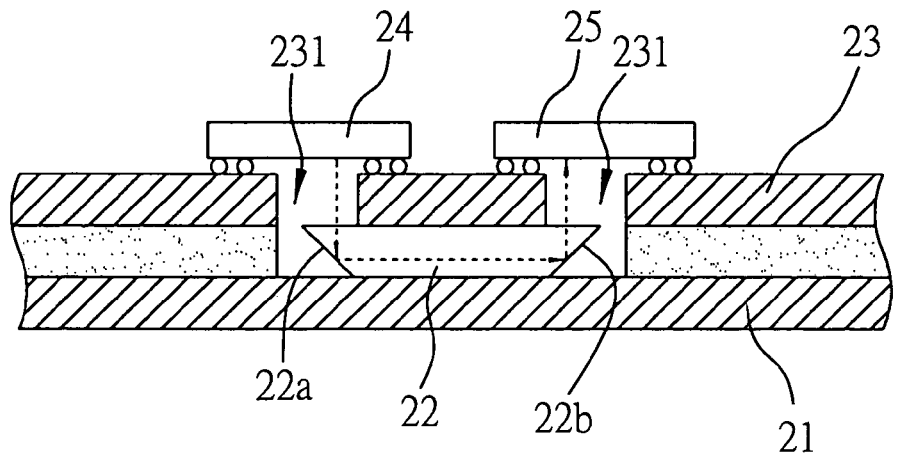
FIG. 1A (PRIOR ART) is a cross-sectional schematic diagram of a conventional opto-electric transmission structure provided on a printed circuit board.
Figure 1B:
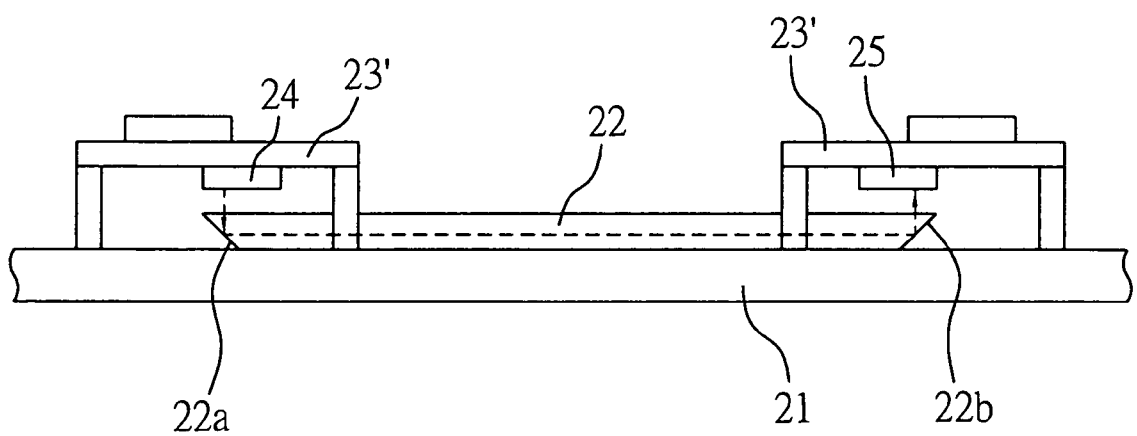
FIG. 1B (PRIOR ART) is a cross-sectional schematic diagram of another conventional opto-electric transmission structure provided on the printed circuit board.
Figure 2:
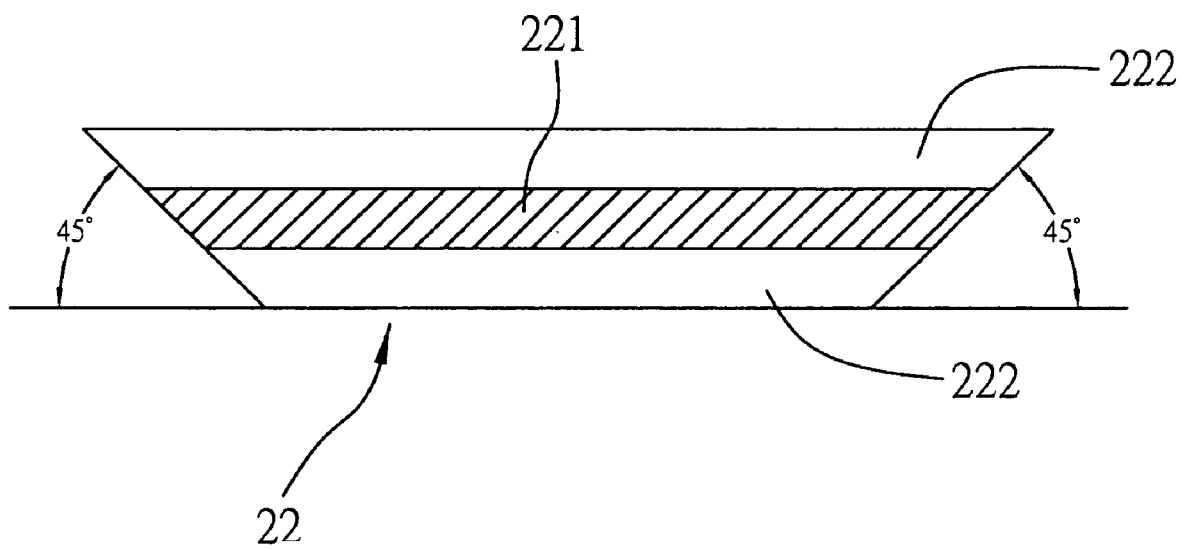
FIG. 2 (PRIOR ART) is a cross-sectional schematic diagram of a waveguide of the conventional opto-electric transmission structure.
Figure 3A:
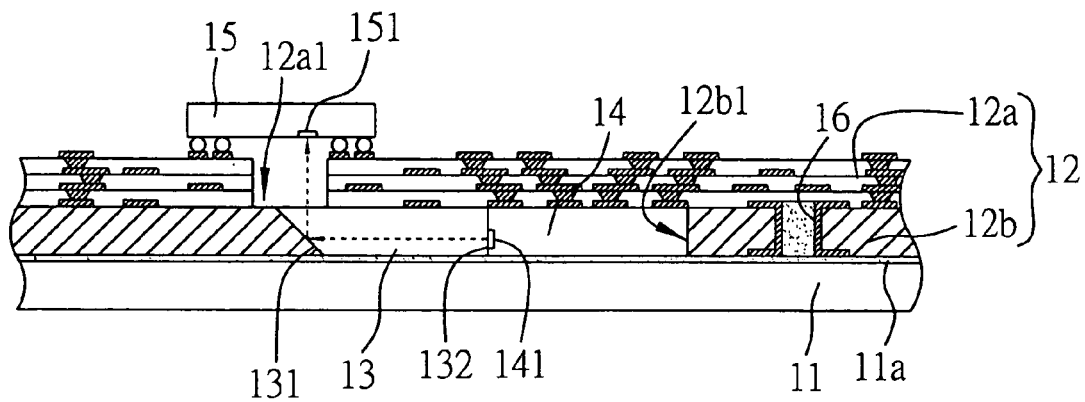
FIG. 3A is a cross-sectional schematic diagram of a structure with embedded opto-electric components in accordance with a preferred embodiment of the present invention.
Figure 3B:
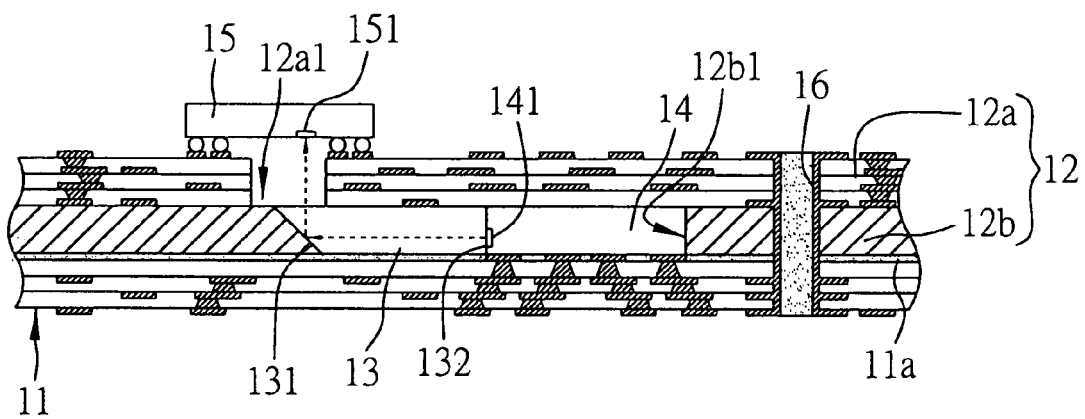
FIG. 3B is a cross-sectional schematic diagram of a structure with embedded opto-electric components in accordance with another preferred embodiment of the present invention.
Figure 3C:
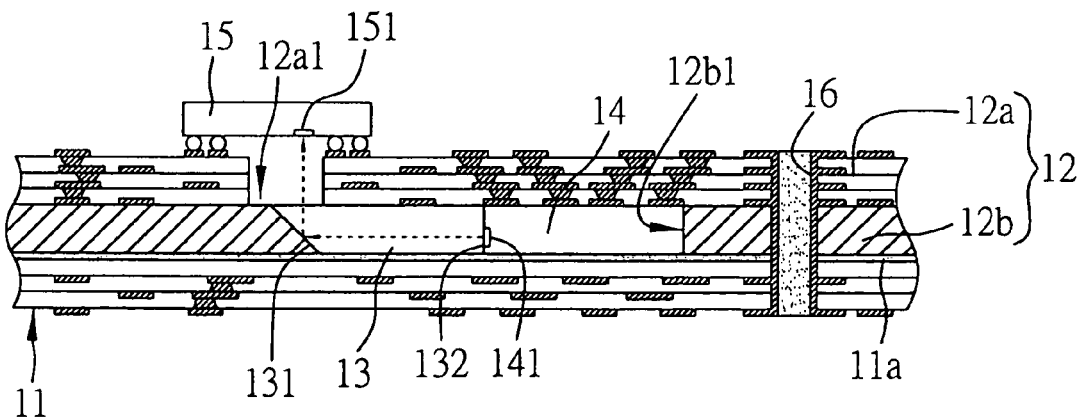
FIG. 3C is a cross-sectional schematic diagram of a structure with embedded opto-electric components in accordance with a further preferred embodiment of the present invention.

FIGS. 3A to 3C are cross-sectional schematic diagrams of the structure with embedded opto-electric components according to the present invention. As shown in FIGS. 3A to 3C, the structure with embedded opto-electric components comprises: a carrier 11, which may be a metallic plate, a ceramic plate, or an organic substrate such as a printed circuit board or an IC (integrated circuit) package substrate; at least one circuit board 12 mounted on the carrier 11, and comprising an upper board 12a (e.g. a printed circuit board or an IC package substrate) and a lower board 12b (e.g. an insulating board), wherein the upper board 12a has a cavity 12a1, and the lower board 12b has a receiving space 12b1 communicating with the cavity 12a1 of the upper board 12a; at least one waveguide 13 mounted on the carrier 11 and having at least one reflection surface 131 positioned by an angle of 45 degrees relative to the carrier 11, wherein the waveguide 13 is embedded in the receiving space 12b1 of the lower layer 12b of the circuit board 12, and the reflection surface 131 of the waveguide 13 is located under the cavity 12a1 of the upper board 12a of the circuit board 12, and wherein the waveguide 13 can be an optical waveguide formed of a polymer material with a light transmission property by printing, coating or laminating, etc.; at least one first opto-electric component 14 embedded in the receiving space 12b1 of the lower layer 12b and mounted on the carrier 11, wherein the first opto-electric component 14 has an active terminal 141 in contact with a transmission terminal 132 of the waveguide 13; and at least one second opto-electric component 15 having an active terminal 151 and mounted on a top surface of the upper board 12a of the circuit board 12, wherein the active terminal 151 of the second opto-electric component 15 corresponds in position to another transmission terminal of the waveguide 13 where the reflection surface 131 is located.

The first opto-electric component 14 and the second opto-electric component 15 are an optical active component and an optical passive component respectively, or are an optical passive component and an optical active component respectively. The optical active component is for example a laser diode (LD), a light emitting diode (LED), or a vertical cavity surface emitting laser (VCSEL) diode, etc. The optical passive component is for example a photodiode (PD) or a photo sensor. Therefore, signals can be transmitted between the first opto-electric component 14 and the second opto-electric component 15 by the waveguide 13.

Referring to FIG. 3A, the carrier 11 is for example a metallic plate or a ceramic plate, such that the carrier 11 serves as a heat dissipating component for the waveguide 13 and the first opto-electric component 14 to improve the heat dissipating efficiency and prolong the lifetime thereof. The upper board 12a is a printed circuit board or IC package substrate with circuits, such that the first opto-electric component 14 and the second opto-electric component 15 can be electrically connected to the upper board 12a. The lower board 12b can be a printed circuit board or IC package substrate with circuits, or an insulating board without circuits. At least one plated through hole 16 is formed in the circuit board 12 to electrically interconnect circuits of the upper board 12a and the lower board 12b.

Referring to FIG. 3B, the carrier 11 is for example an organic substrate such as a printed circuit board or an IC package substrate, such that the first opto-electric component 14 can be electrically connected to the carrier 11. The upper board 12a is a printed circuit board or IC package substrate with circuits, wherein the second opto-electric component 15 is mounted on the upper board 12a. The lower board 12b can be a printed circuit board or IC package substrate with circuits, or an insulating board without circuits. At least one plated through hole 16 is formed in the circuit board 12 and the carrier 11 to electrically interconnect circuits of the carrier 11, the upper board 12a and the lower board 12b.

Referring to FIG. 3C, the carrier 11 is an organic substrate with circuits. The upper board 12a is a printed circuit board or IC package substrate with circuits, such that the first opto-electric component 14 and the second opto-electric component 15 can be electrically connected to the upper board 12a. The lower board 12b is an insulating board, a printed circuit board or an IC package substrate. At least one plated through hole 16 is formed in the circuit board 12 and the carrier 11 to electrically interconnect circuits of the carrier 11, the upper board 12a and the lower board 12b.

Figure 4:
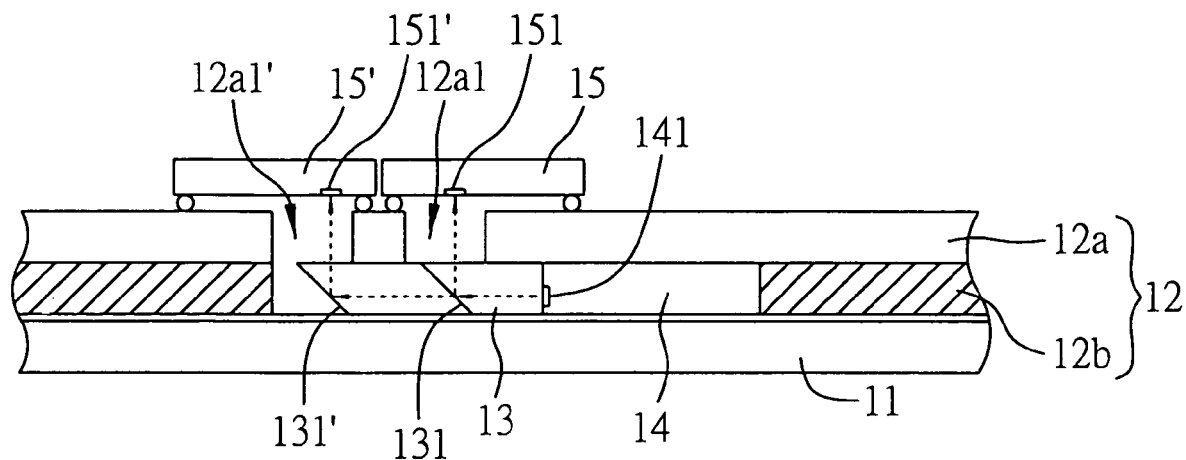
FIG. 4 is a cross-sectional schematic diagram of a structure with embedded opto-electric components for transmission of two optical signals in accordance with a further preferred embodiment of the present invention.
Figure 5A:
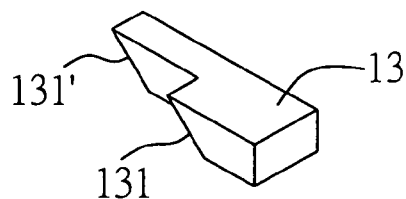
FIG. 5A is a perspective view of an example of a waveguide of the structure shown in FIG. 4.

FIGS. 4 and 5A are cross-sectional schematic diagrams of the structure with embedded opto-electric components according to a further preferred embodiment of the present invention. This embodiment differs from the foregoing embodiments shown in FIGS. 3A, 3B and 3C in that, the waveguide 13 has at least two reflection surfaces 131, 131', and the upper board 12a of the circuit board 12 is formed with corresponding cavities 12a1, 12a1', wherein at least two second opto-electric components 15, 15' are mounted on the cavities 12a1, 12a1' and correspond to at least one first opto-electric component 14.

If the first opto-electric component 14 is an active component and the second opto-electric components 15, 15' are passive components, the first opto-electric component 14 which has active terminal 141 emits an optical signal that can be received simultaneously by the two second opto-electric components 15, 15' which have active terminals 151 and 151' respectively, such that the single optical signal is divided into two optical signals for individual processing.

Alternatively, if the second opto-electric components 15, 15' are active components and the first opto-electric component 14 is a passive component, the two second opto-electric components 15, 15' emit two optical signals that are received simultaneously by the first opto-electric component 14 for signal processing. In another case, the at least one first opto-electric component comprises two opto-electric components for performing receiving and emitting of optical signals with the two second opto-electric components, respectively.

Figure 5B:
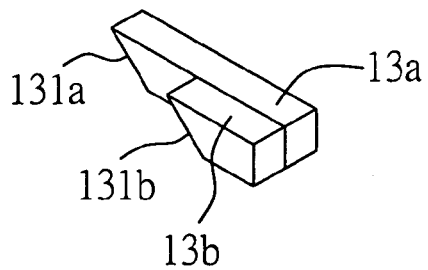
FIG. 5B is a perspective view of another example of the waveguide of the structure shown in FIG. 4.

Referring to FIG. 5B, which shows an alternative example of the waveguide in the present invention, the waveguide 13 comprises a first waveguide member 13a and a second waveguide member 13b. A terminal of the first waveguide member 13a is formed with a reflection surface 131a, and a terminal of the second waveguide member 13b is formed with a reflection surface 131b. The first and second waveguide members 13a, 13b have different lengths, such that the reflection surfaces 131a, 131b thereof are staggered in position. This arrangement can similarly achieve the foregoing effects. It showed be noted the present invention is not limited to the use of two waveguide members as described above.

The present invention is to mount the opto-electric components and the waveguide in the receiving space of the lower board of the circuit board that is supported by the carrier, such that photo beam loss during a transmission process can be reduced, occupation of space is avoided, and the structure is simplified.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure with embedded opto-electric components, comprising:
    a carrier;
    at least one circuit board mounted on a surface of the carrier, said circuit board comprising an upper board and a lower board, wherein the upper board has a cavity and the lower board has a receiving space communicating with the cavity;
    at least one waveguide embedded in the receiving space of the lower board;
    at least one first opto-electric component having an active terminal and embedded in an inner layer of the circuit board, wherein the active terminal of the first opto-electric component is in contact with a first transmission terminal of the waveguide; and
    at least a second opto-electric component having an active terminal and being mounted on a surface of the circuit board free of being attached to the carrier, wherein the active terminal of the second opto-electric component corresponds in position to another transmission terminal of the waveguide via the cavity.

2. The structure of claim 1, wherein the carrier is one of a metallic plate, a ceramic plate, and an organic substrate.

3. The structure of claim 2, wherein the organic substrate is one of a printed circuit board and an IC (integrated circuit) package substrate.

4. The structure of claim 1, wherein the upper board is one of a printed circuit boar and an IC package substrate.

5. The structure of claim 1, wherein the lower board is one of a metallic plate, a ceramic plate, an insulating board, a printed circuit board, and an IC package substrate.

6. The structure of claim 1, wherein the first transmission terminal of the waveguide is in contact with the active terminal of the first opto-electric component, and at least one reflection surface is provided at the said another transmission terminal of the waveguide corresponding in position to the active terminal of the second opto-electric component.

7. The structure of claim 1, wherein the waveguide comprises a plurality of waveguide members, each of said waveguide members formed with a reflection surface, and each of said waveguide members having different lengths such that the reflection surfaces thereof are staggered in position.

8. The structure of claim 1, wherein the first opto-electric component is one of an optical active component an optical passive component.

9. The structure of claim 8, wherein the optical active component is one of a laser diode, a light emitting diode, and a vertical cavity surface emitting laser diode.

10. The structure of claim 8, wherein the optical passive component is one of a photodiode and a photo sensor.

11. The structure of claim 1, wherein the second opto-electric component is one of an optical active component and an optical passive component.

12. The structure of claim 11, wherein the optical active component is one of a laser diode, a light emitting diode, and a vertical cavity surface light emitting laser diode.

13. The structure of claim 11, wherein the optical passive component is one of a photodiode and a photo sensor.

* * * * *